US009583696B2

(12) United States Patent
Gottwald et al.

(10) Patent No.: US 9,583,696 B2
(45) Date of Patent: Feb. 28, 2017

(54) REFERENCE LAYER FOR PERPENDICULAR MAGNETIC ANISOTROPY MAGNETIC TUNNEL JUNCTION

(71) Applicant: QUALCOMM Incorporated, San Diego, CA (US)

(72) Inventors: Matthias Georg Gottwald, Leuven (BE); Chando Park, San Diego, CA (US); Xiaochun Zhu, San Diego, CA (US); Kangho Lee, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 8 days.

(21) Appl. No.: 14/460,731

(22) Filed: Aug. 15, 2014

(65) Prior Publication Data

US 2015/0263266 A1    Sep. 17, 2015

Related U.S. Application Data

(60) Provisional application No. 61/951,910, filed on Mar. 12, 2014.

(51) Int. Cl.
*G11C 11/16* (2006.01)
*H01L 43/08* (2006.01)

(52) U.S. Cl.
CPC ............ *H01L 43/08* (2013.01); *G11C 11/161* (2013.01); *G11C 11/1673* (2013.01)

(58) Field of Classification Search
CPC .... G11C 11/161; G11C 11/1673; H01L 43/08
See application file for complete search history.

(56) References Cited

U.S. PATENT DOCUMENTS

| 6,625,059 | B1 | 9/2003 | Sharma et al. | |
|---|---|---|---|---|
| 7,079,361 | B2 * | 7/2006 | Sugita | B82Y 10/00 360/324 |
| 7,190,613 | B2 | 3/2007 | Nagase et al. | |
| 8,755,152 | B1 * | 6/2014 | Park | G01R 33/093 360/319 |
| 9,478,735 | B1 * | 10/2016 | Chen | H01L 43/08 |
| 2004/0008537 | A1 | 1/2004 | Sharma et al. | |
| 2006/0003185 | A1 * | 1/2006 | Parkin | B82Y 10/00 428/692.1 |
| 2011/0141803 | A1 * | 6/2011 | Kim | B82Y 25/00 365/171 |

(Continued)

OTHER PUBLICATIONS

International Search Report and Written Opinion—PCT/US2015/017778—ISA/EPO—May 8, 2015, 10 pages.

(Continued)

*Primary Examiner* — Khamdan Alrobaie
(74) *Attorney, Agent, or Firm* — Toler Law Group, PC

(57) ABSTRACT

An apparatus includes a perpendicular magnetic anisotropy magnetic tunnel junction (pMTJ) device. The pMTJ device includes a storage layer and a reference layer. The reference layer includes a portion configured to produce a ferrimagnetic effect. The portion includes a first layer, a second layer, and a third layer. The second layer is configured to antiferromagnetically (AF) couple the first layer and the third layer during operation of the pMTJ device.

28 Claims, 4 Drawing Sheets

(56) References Cited

U.S. PATENT DOCUMENTS

| | | | |
|---|---|---|---|
| 2011/0303997 A1* | 12/2011 | Wang | B82Y 25/00 |
| | | | 257/421 |
| 2013/0001717 A1* | 1/2013 | Zhou | H01F 10/3286 |
| | | | 257/421 |
| 2013/0107616 A1 | 5/2013 | Ohno et al. | |
| 2013/0163314 A1 | 6/2013 | Yamane et al. | |
| 2013/0240963 A1 | 9/2013 | Beach et al. | |
| 2013/0307102 A1 | 11/2013 | Oh et al. | |
| 2013/0334633 A1* | 12/2013 | Zhou | H01L 43/10 |
| | | | 257/421 |
| 2014/0027869 A1 | 1/2014 | Lee et al. | |
| 2014/0084398 A1* | 3/2014 | Oguz | H01L 43/12 |
| | | | 257/421 |
| 2014/0306302 A1* | 10/2014 | Jan | H01L 43/10 |
| | | | 257/421 |
| 2015/0008550 A1* | 1/2015 | Min | H01F 10/32 |
| | | | 257/421 |
| 2015/0171316 A1* | 6/2015 | Park | H01L 43/10 |
| | | | 257/421 |
| 2015/0255135 A1* | 9/2015 | Tran | G11C 11/161 |
| | | | 365/158 |
| 2016/0163966 A1* | 6/2016 | Hu | H01L 43/10 |
| | | | 365/158 |

OTHER PUBLICATIONS

Bandiera, S. et al., "Comparison of Synthetic Antiferromagnets and Hard Ferromagnets as Reference Layer in Magnetic Tunnel Junctions With Perpendicular Magnetic Anisotropy," IEEE Magnetics Letters, Jul. 8, 2010, vol. 1, 4 pages.

Choi, G. M. et al., "Perpendicular magnetic tunnel junctions with synthetic ferrimagnetic pinned layer," Journal of Applied Physics, Oct. 6, 2010, vol. 108, pp. 073913-1-073913-5.

Itoh, Hidetake et al., "Coexistence of the uniaxial anisotropy and the antiferromagnetic coupling in Co/Ir(1 1 1) superlattices," Journal of Magnetism and Magnetic Materials 257 (2003), pp. 184-189.

Khvalkovskiy, A. V. et al., "Basic principles of STT-MRAM cell operation in memory arrays," Journal of Physics D: Applied Physics, Jan. 31, 2013, vol. 46, pp. 1-20.

Mangin, S. et al., "Engineered materials for all-optical helicity-dependent magnetic switching," Nature Materials, Advance Online Publication, www.nature.com/naturematerials, 7 pages.

Tadisina, Z. R. et al., "Magnetic Tunnel Junctions with Co-Based Perpendicular Magnetic Anisotropy Multilayers," URL: http://mint.ua.edu/wp-content/uploads/2010/07/fall2009_18.pdf, The University of Alabama, Center for Materials for Information Technology, 2010, 1 page.

* cited by examiner

REFERENCE LAYER FOR PERPENDICULAR MAGNETIC ANISOTROPY MAGNETIC TUNNEL JUNCTION

I. CROSS-REFERENCE TO RELATED APPLICATIONS

The present application claims priority from U.S. Provisional Patent Application No. 61/951,910, filed Mar. 12, 2014 and entitled "REFERENCE LAYER FOR PERPENDICULAR MAGNETIC ANISOTROPY MAGNETIC TUNNEL JUNCTION," the content of which is incorporated by reference in its entirety.

II. FIELD

The present disclosure is generally related to memory devices and more particularly to magnetoresistive memory devices.

III. DESCRIPTION OF RELATED ART

Advances in technology have resulted in smaller and more powerful electronic devices. For example, there currently exist a variety of mobile devices, such as wireless telephones, personal digital assistants (PDAs), and paging devices. The mobile devices may be small, lightweight, and easily carried by users. Wireless telephones, such as cellular telephones and Internet Protocol (IP) telephones, can communicate voice and data packets over wireless networks. Further, many wireless telephones include other types of devices that are incorporated therein. For example, a wireless telephone can also include a digital still camera, a digital video camera, a digital recorder, and an audio file player. Also, wireless telephones can process executable instructions including software applications, such as a web browser application, that can be used to access the Internet. Wireless telephones and other mobile devices may include memory devices to store instructions and other information. The memory devices may include a non-volatile memory device, such as a magnetoresistive random access memory (MRAM) device.

An MRAM device may include a magnetic tunnel junction (MTJ) that has a resistance value that can be adjusted by configuring a magnetic property of the MTJ. For example, a resistance value of an MTJ may be adjusted by passing a switching current through the MTJ to modify a magnetic property of the MTJ. The MTJ may have a "preferred" magnetic orientation (or magnetic anisotropy) that affects operation of the MTJ.

An "in-plane" magnetic anisotropy MTJ (iMTJ) may be associated with a first magnetic anisotropy, where a magnetic moment of a layer of the iMTJ is substantially parallel to a surface of the layer. A "perpendicular" magnetic anisotropy MTJ (pMTJ) may be associated with a second magnetic anisotropy, where a magnetic moment of a layer of the pMTJ is substantially perpendicular to a surface of the layer. To illustrate, an iMTJ may have a magnetic moment that is oriented in a first direction (e.g., left and right) relative to a cross section of the iMTJ, and a pMTJ may have a magnetic moment that is oriented in a second direction (e.g., up and down) relative to a cross section of the pMTJ. Memory devices including iMTJs may be associated with different performance characteristics (e.g., different switching currents) as compared to memory devices that include pMTJs.

IV. SUMMARY

A perpendicular magnetic anisotropy magnetic tunnel junction (pMTJ) device may include a storage layer and a reference layer. The storage layer may have a "free" magnetic state that can be adjusted via a switching current through the pMTJ, and the reference layer may have a reference magnetic state (or "fixed" state). The reference layer includes a portion configured to produce a ferrimagnetic effect. For example, the portion may include a synthetic ferrimagnet (SFi). The portion may include a first layer, a second layer, and a third layer. The second layer may be configured to antiferromagnetically (AF) couple the first layer and the third layer during operation of the pMTJ device to enable a perpendicular magnetic anisotropy (PMA) of the pMTJ device while reducing or canceling one or more local components of a "stray" magnetic field generated by the reference layer during operation of the pMTJ device.

To further illustrate, a reference layer of a conventional pMTJ device may include one or more materials that enable PMA of the pMTJ. However, such materials may be associated with a stray dipolar magnetic field that can reduce performance of the pMTJ. To compensate for the stray dipolar magnetic field, a synthetic antiferromagnet (SAF) may be included within the reference layer to reduce an average magnitude of the stray dipolar magnetic field. An SAF may include a cobalt/platinum (Co/Pt) interface. Although the SAF may reduce the average magnitude of the stray dipolar magnetic field, certain areas of the pMTJ device may experience a relatively high value (or local "maxima") of the stray dipolar magnetic field. The relatively high values of the stray dipolar field may reduce performance and reliability of the pMTJ device.

A reference layer in accordance with the present disclosure may enable PMA while also reducing a local magnetic moment of the reference layer via a ferrimagnetic effect, thus locally reducing or canceling a stray dipolar magnetic field. For example, a ferrimagnetic effect of a portion of the reference layer may increase homogeneity of the stray dipolar magnetic field by reducing or canceling "local" variations of the stray dipolar magnetic field. Increasing homogeneity of the stray dipolar magnetic field may enhance device performance by increasing device reliability, such as by reducing or eliminating local "maxima" of the stray dipolar magnetic field that can reduce device performance and reliability.

In a particular embodiment, an apparatus includes a perpendicular magnetic anisotropy magnetic tunnel junction (pMTJ) device. The pMTJ device includes a storage layer and a reference layer. The reference layer includes a portion configured to produce a ferrimagnetic effect. The portion includes a first layer, a second layer, and a third layer. The second layer is configured to antiferromagnetically (AF) couple the first layer and the third layer during operation of the pMTJ device In another particular embodiment, a method includes biasing a perpendicular magnetic anisotropy magnetic tunnel junction (pMTJ) device to generate a magnetic state at the pMTJ device. The method further includes initiating a sense operation to determine the magnetic state using a reference layer of the pMTJ device. The reference layer includes a portion that produces a ferrimagnetic effect during the sense operation. The portion includes a first layer, a second layer, and a third layer. The second layer antiferromagnetically (AF) couples the first layer and the third layer during the sense operation.

In another particular embodiment, an apparatus includes a perpendicular magnetic anisotropy magnetic tunnel junction (pMTJ) device. The pMTJ device includes means for generating a configurable magnetic state and means for generating a reference magnetic state. The means for generating the reference magnetic state includes means for producing a ferrimagnetic effect. The means for producing the ferrimagnetic effect includes means for generating a first magnetic field, means for generating a second magnetic field, and means for antiferromagnetically (AF) coupling the means for generating the first magnetic field and the means for generating the second magnetic field.

In another particular embodiment, a computer-readable medium stores instructions that are executable by a processor. The computer-readable medium includes a perpendicular magnetic anisotropy magnetic tunnel junction (pMTJ) device. The pMTJ device includes a storage layer and a reference layer. The reference layer includes a first layer, a second layer, and a third layer. The second layer is configured to antiferromagnetically (AF) couple the first layer and the third layer during operation of the pMTJ device.

One particular advantage provided by at least one of the disclosed embodiments is that a reference layer may enable perpendicular magnetic anisotropy (PMA) of a perpendicular magnetic anisotropy magnetic tunnel junction (pMTJ) device while reducing or canceling a stray dipolar magnetic field generated by the reference layer during operation of the pMTJ device. Reducing or canceling the stray dipolar magnetic field may improve operation of a magnetoresistive random access memory (MRAM) device that includes the pMTJ device, such as by enhancing reliability of the pMTJ device. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
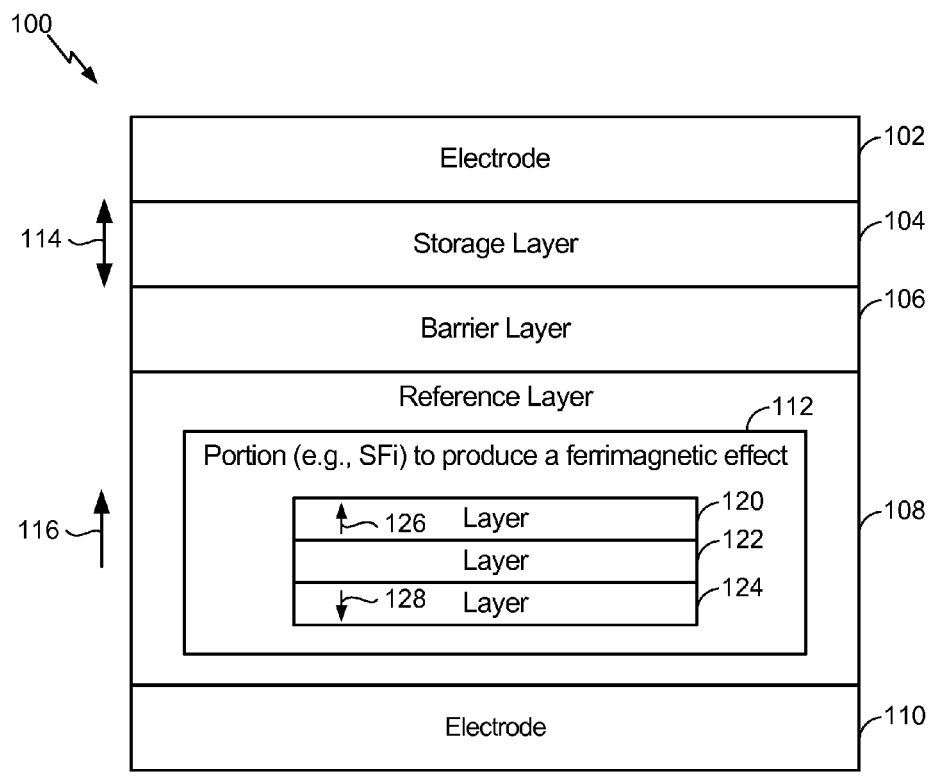
FIG. 1 is a block diagram of a particular illustrative embodiment of a perpendicular magnetic anisotropy magnetic tunnel junction (pMTJ) device that includes a portion to produce a ferrimagnetic effect.

Referring to FIG. 1, a particular illustrative embodiment of a perpendicular magnetic anisotropy magnetic tunnel junction (pMTJ) device is disclosed and generally designated 100. The pMTJ device 100 includes an electrode 102, a storage layer 104 (also referred to as a "free" layer or a "data" layer), a barrier layer 106, a reference layer 108 (also referred to as a "fixed" layer or a "pinned" layer), and an electrode 110. In an illustrative embodiment, the pMTJ device 100 is integrated within a magnetoresistive random access memory (MRAM) device.

FIG. 1 illustrates that a first surface of the storage layer 104 may be in contact with the electrode 102, and a second surface of the storage layer 104 may be in contact with the barrier layer 106. A first surface of the barrier layer 106 may be in contact with the storage layer 104, and a second surface of the barrier layer 106 may be in contact with the reference layer 108. A first surface of the reference layer 108 may be in contact with the barrier layer 106, and a second surface of the reference layer 108 may be in contact with the electrode 110.

The storage layer 104 may have a magnetic state 114 that can be modified. For example, a bias signal may be applied at the electrode 102 to generate a switching current through the pMTJ device 100. The switching current may "switch" an orientation of the magnetic state 114 (e.g., a direction of a magnetic moment of the storage layer 104) relative to the reference layer 108. For example, the switching current may switch the magnetic state 114 from being parallel relative to a magnetic state of the reference layer 108 to being antiparallel relative to the magnetic state of the reference layer 108 (or vice versa).

The barrier layer 106 may be connected to the storage layer 104 and to the reference layer 108. The barrier layer 106 may be configured to enable a tunnel magnetoresistance (TMR) effect during operation of the pMTJ device 100. The barrier layer 106 may include magnesium oxide and/or aluminum oxide, as illustrative examples. In a particular embodiment, the pMTJ device 100 includes a cobalt/iron/boron (Co/Fe/B) alloy that is inserted at a junction between the reference layer 108 and the barrier layer 106.

The reference layer 108 may include a layer 120, a layer 122, and a layer 124. The layers 120, 124 each have a magnetic component that is perpendicular to the plane of formation of the layers 120, 124 (i.e., perpendicular to a surface of a substrate on which the pMTJ device 100 is formed). For example, the layer 120 may have a magnetic state 126 (e.g., a first magnetic moment), and the layer 124 may have a magnetic state 128 (e.g., a second magnetic moment).

The layer 122 may be configured to antiferromagnetically (AF) couple the layer 120 and the layer 124 during operation of the pMTJ device 100. To illustrate, the layer 122 may have a size and/or may include one or more materials (e.g., iridium) selected to cause the magnetic states 126, 128 to have opposite directions to AF couple the layers 120, 124. As a result, the magnetic states 126, 128 may have opposite (or substantially opposite) orientations while also being perpendicular to the plane of formation of the layers 120, 124, as illustrated in the example of FIG. 1. Thus, the layers 120, 124 may be AF coupled via the layer 122. The layers 120, 122, and 124 may form a portion 112 (e.g., a structure) that is configured to produce a ferrimagnetic effect. The portion 112 may be a synthetic ferrimagnet (SFi).

The reference layer 108 may have a magnetic state 116 (e.g., a direction of a magnetic moment of the reference layer 108). The magnetic state 116 may correspond to a sum of individual magnetic states of portions of the reference layer 108 (e.g., a sum of the magnetic states 126, 128). For example, the layers 120 and 124 may each have a perpendicular magnetic component that contributes to the magnetic state 116. The magnetic state 116 may have an orientation that is stable (or that is substantially stable) relative to the magnetic state 114. For example, the magnetic state 116 may be substantially unaffected by switching currents generated through the pMTJ device 100. Accordingly, the reference layer 108 may be configured to stabilize the pMTJ device 100 during operation of the pMTJ device 100.

The portion 112 is configured to reduce a magnetic field generated by the reference layer 108 during operation of the pMTJ device 100. For example, the portion 112 may be a cobalt/iridium (Co/Ir) multilayer structure that includes layers of cobalt and iridium. As described further below, the portion 112 may enable perpendicular magnetic anisotropy (PMA) of the pMTJ device 100 while also reducing a "stray" dipolar magnetic field (or "offset" magnetic field) associated with the reference layer 108. The portion 112 may reduce an average magnitude of the stray dipolar magnetic field while also increasing homogeneity (or "uniformity") of the stray dipolar magnetic field.

The electrodes 102, 110 may include one or more conductive materials configured to bias the pMTJ device 100. To illustrate, the electrode 102 may correspond to a "top" electrode that is responsive to a bias signal, and the electrode 110 may correspond to a "bottom" electrode that is responsive to a low or zero voltage (e.g., a ground potential). In an illustrative embodiment, the electrode 102 is connected to an interconnect layer of an integrated circuit, and the electrode 110 is connected to a substrate of the integrated circuit. The integrated circuit may include an MRAM device.

In operation, the orientation of the magnetic state 114 may be sensed or modified by applying a bias signal at the electrode 102 (e.g., to generate a switching current through the pMTJ device 100). The example of FIG. 1 illustrates that the magnetic state 114 can be adjusted to have an orientation that is either up or down relative to the cross sectional view of the pMTJ device 100 illustrated in FIG. 1. The example of FIG. 1 further illustrates that the magnetic state 116 of the reference layer 108 may be oriented up relative to the cross sectional view of the pMTJ device 100 illustrated in FIG. 1. In one or more other implementations, the magnetic states 114, 116 may have one or more other orientations (e.g., the magnetic state 116 may be oriented down relative to the cross sectional view of the pMTJ device 100 illustrated in FIG. 1).

A first orientation of the magnetic state 114 relative to the magnetic state 116 causes a first resistance to current across the pMTJ device 100 and may indicate a first value stored by the pMTJ device 100. For example, a parallel orientation of the magnetic state 114 relative to the magnetic state 116 may indicate a logical "0" bit stored by the pMTJ device 100. As another example, an anti-parallel orientation of the magnetic state 114 relative to the magnetic state 116 causes a second resistance that is different from the first resistance and may indicate a logical "1" bit stored by the pMTJ device 100. In one or more other implementations, a parallel orientation of the magnetic state 114 relative to the magnetic state 116 may indicate a logical "1" bit and an anti-parallel orientation of the magnetic state 114 relative to the magnetic state 116 may indicate a logical "0" bit.

The pMTJ device 100 may be biased (e.g., by applying a bias signal at the electrode 102) to generate an orientation of the magnetic state 114 (e.g., to store a value to the pMTJ device 100). After generating the orientation of the magnetic state 114, the pMTJ device 100 may be sensed to determine the orientation of the magnetic state using the reference layer 108 (e.g., to read the value stored at the pMTJ device 100). For example, the reference layer 108 may provide a stable (or "fixed") reference magnetic orientation via the magnetic state 116 during operation of the pMTJ device 100. The magnetic state 114 may be sensed based on a read current through the pMTJ device 100 that indicates whether the pMTJ device 100 has the first resistance (indicating the first orientation of the magnetic state 114) or the second resistance (indicating the second orientation of the magnetic state 114).

Operation of the pMTJ device 100 may generate one or more magnetic fields. To illustrate, in a typical pMTJ configuration, the reference layer 108 includes one or more materials that induce perpendicular magnetic anisotropy (PMA) of the pMTJ device 100. The one or more materials may include cobalt, iron, and/or boron, such as a cobalt/iron/boron (Co/Fe/B) alloy that is inserted at a junction between the reference layer 108 and the barrier layer 106. Such materials may enable PMA of the pMTJ device 100 while also generating a "stray" dipolar magnetic field that can reduce performance of the pMTJ device 100.

The portion 112 may be configured to reduce an average magnitude of the stray dipolar magnetic field while also locally reducing the stray dipolar magnetic field (e.g., by increasing homogeneity of the stray dipolar magnetic field). To illustrate, the portion 112 may include a ferrimagnet structure (e.g., an SFi structure) that is configured to reduce the stray dipolar magnetic field while also increasing homogeneity of the stray dipolar magnetic field via a ferrimagnetic effect. In a particular embodiment, the absolute value of the average magnitude of the stray dipolar magnetic field is approximately 100 oersted (Oe) or less. For example, depending on the particular implementation, the average magnitude of the stray dipolar magnetic field may be 109 Oe or −66 Oe, as illustrative examples. A synthetic antiferromagnet (SAF) device may be associated with a greater absolute value of the average magnitude of the stray dipolar magnetic field. For example, an SAF device may be associated with a stray dipolar magnetic field having an average magnitude of −115 Oe. It should be appreciated that such parameters may depend on the particular application and are provided for illustrative purposes.

The example of FIG. 1 illustrates techniques for enabling high PMA of a pMTJ device while also reducing or canceling a stray dipolar magnetic field associated with operation of a pMTJ device. Reducing or canceling the stray dipolar magnetic field may enhance device performance by increasing "scalability" of a device (e.g., by decreasing performance differences between different device sizes), which may increase similarity of device performance for different device sizes. Reducing or canceling the stray dipolar magnetic field may increase system stability, such as by reducing interaction between the stray dipolar magnetic field and one or more device process variations (e.g., etch damage and/or one or more other process effects) that can undesirably affect device performance. Further, a thickness of the reference layer 108 may be less than a thickness of a conventional reference layer that includes a synthetic antiferromagnet (SAF), such as a cobalt-platinum-ruthenium SAF. In a particular embodiment, the reference layer 108 has a thickness of between approximately 30 to 150 angstrom (Å) (as compared to an SAF-based reference layer that may have a thickness of greater than 200 Å).

In a particular embodiment, cobalt-iridium junctions are included in the portion 112 to enable a high PMA of the pMTJ device 100. The portion 112 may further include cobalt layers that are antiferromagnetically (AF) coupled via the cobalt-iridium junctions to reduce a local magnetic moment of the reference layer 108. A reference layer in accordance with the present disclosure may therefore enable high PMA and AF coupling of layers of a reference layer. Conventional devices, such as certain cobalt/platinum (Co/Pt)-based reference layers, may utilize multi-layers to enable PMA without AF coupling the multi-layers, which may lead to a highly inhomogeneous stray field. The high PMA and the AF coupling of the reference layer 108 may produce a ferrimagnetic effect of the reference layer 108, which may cancel or reduce a stray dipolar magnetic field, as described further with reference to FIG. 2.

Figure 2:
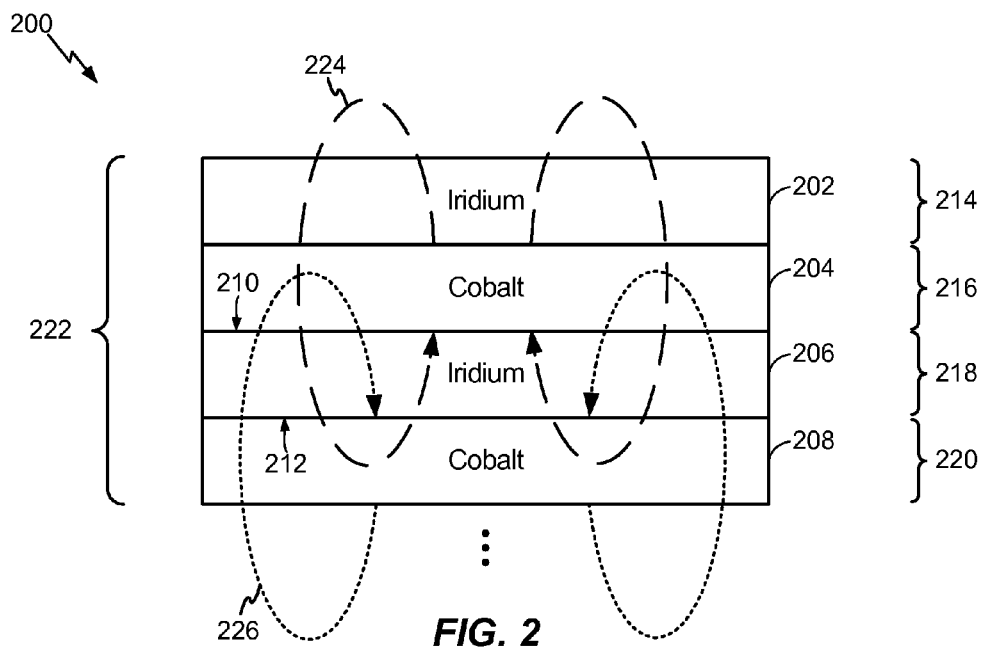
FIG. 2 is a block diagram of a particular illustrative embodiment of a structure that may be implemented within the portion of the pMTJ device of FIG. 1.

Referring to FIG. 2, a particular illustrative embodiment of a structure is depicted and generally designated 200. The structure 200 may be integrated within the pMTJ device 100 of FIG. 1. For example, the structure 200 may correspond to the portion 112 of FIG. 1. The structure 200 may correspond to a multilayer synthetic ferrimagnet (SFi) (or "artificial" ferrimagnet) that is configured to produce a ferrimagnetic effect. The ferrimagnetic effect may reduce the effect of a stray dipolar magnetic field on a storage layer, such as the storage layer 104 of FIG. 1.

The structure 200 may include multiple layers. Each of the multiple layers may include a material. In the example of FIG. 2, the multilayer structure includes a layer 202, a layer 204, a layer 206, and a layer 208. In an illustrative embodiment, the layers 204, 208 correspond to the layers 120, 124, and the layer 206 corresponds to the layer 122.

The layers 202, 206 may include iridium (Ir), and the layers 204, 208 may include cobalt (Co). In FIG. 2, the structure 200 includes a first layer (e.g., the layer 202) of a first material (e.g., iridium), a second layer (e.g., the layer 204) of a second material (e.g., cobalt), and a third layer (e.g., the layer 206) of the first material. The structure 200 may further include a fourth layer (e.g., the layer 208) of the second material.

The structure 200 may be connected to the barrier layer 106 and to the electrode 110 of FIG. 1. For example, the layer 202 may be connected to the barrier layer 106, and the layer 208 may be connected to the electrode 110. To further illustrate, a top surface of the layer 202 may be connected to a bottom surface of the barrier layer 106, and the bottom surface of the layer 208 may be connected to a top surface of the electrode 110. In another embodiment, the layer 202 may be coupled to the barrier layer 106 via one or more other layers, such as a Co/Fe/B layer, as described with reference to FIG. 1.

Adjacent layers of the structure 200 may form a junction. For example, the layers 204, 206 may form a junction 210 (e.g., a first Co/Ir interface). As another example, the layers 206, 208 may form a junction 212 (e.g., a second Co/Ir interface). The junctions 210, 212 may enable perpendicular magnetic anisotropy (PMA), such as to enable PMA of the pMTJ device 100 of FIG. 1.

In a particular embodiment, "neighboring" cobalt layers of the structure 200 are magnetically coupled, such as by being antiferromagnetically (AF) coupled (also referred to as AF "exchange" coupled) through an intermediate iridium layer. To illustrate, in the example of FIG. 2, the layers 204, 208 may be AF coupled though the layer 206. The layer 206 may have a dimension (e.g., thickness) that is selected to cancel (or reduce) a local magnetic moment of the layers 204, 208, thus AF coupling the layers 204, 208. AF coupling the layers 204, 208 may reduce an effect of a stray dipolar magnetic field by canceling (or reducing) the stray dipolar magnetic field.

To further illustrate, FIG. 2 depicts that the layer 204 may generate a stray dipolar magnetic field having an illustrative magnetic field component 224, and the layer 208 may generate a stray dipolar magnetic field having an illustrative magnetic field component 226. By AF coupling the layers 204, 208 through the layer 206, a local magnetic moment associated with the layers 204, 208 is reduced (e.g., is canceled by opposite directions of the magnetic field components 224, 226), producing a ferrimagnetic effect associated with the structure 200. In a particular embodiment, the structure 200 is integrated in the reference layer 108, and the structure 200 reduces (or cancels) a stray dipolar magnetic field generated by the reference layer 108 via the ferrimagnetic effect.

Each of the layers 202, 204, 206, and 208 may be associated with a corresponding thickness. In FIG. 2, the layer 202 has a thickness 214, the layer 204 has a thickness 216, the layer 206 has a thickness 218, and the layer 218 has a thickness 220. The thicknesses 214, 216, 218, and 220 may be selected on the particular application (e.g., based on design parameters, circuit operation characteristics, and/or fabrication process). As an illustrative, non-limiting example, the thicknesses 216, 220 may each be between approximately 3 to 15 angstrom (Å), and the thicknesses 214, 218 may each be between approximately 4.5 to 5 Å. The thicknesses 216, 220 may be selected to enable a particular PMA at the structure 200. As an illustrative, non-limiting example, the thicknesses 216, 220 may each be selected to be approximately 10 Å to achieve a high PMA for a particular device configuration.

The layers 202, 204, 206, and 208 may form a multilayer structure 222 (e.g., a Co/Ir multilayer structure, such as a Co/Ir multilayer "heterostructure"). The multilayer structure 222 may be "stacked" on one or more additional such structures. For example, the structure 200 may include a positive integer number N of multilayer structures corresponding to the multilayer structure 222. As a particular, non-limiting example, the structure 200 may include five multilayer structures corresponding to the multilayer structure 222. In this illustrative example, N=5, and the structure 200 includes ten layers of cobalt and ten layers of iridium. Alternatively, the structure 200 may have another configuration (e.g., may include another positive integer number N of multilayer structures corresponding to the multilayer structure 222, may include another number of cobalt layers, and/or may include another number of iridium layers). In a particular embodiment, N is selected based on a stray dipolar magnetic field associated with the pMTJ device 100. For example, N may be selected to offset an "expected" stray dipolar magnetic field that would occur at the reference layer 108 during operation of the pMTJ device 100 if N=0.

The structure 200 of FIG. 2 enables improved operation of a perpendicular magnetic anisotropy magnetic tunnel junction (pMTJ) device, such as the pMTJ device 100 of FIG. 1. For example, the structure 200 may reduce an average magnitude of a stray dipolar magnetic field while also "locally" reducing the stray dipolar magnetic field (e.g., by increasing homogeneity of the stray dipolar magnetic field). To further illustrate, a conventional synthetic antiferromagnet (SAF) device may reduce an average value of a stray dipolar magnetic field by reducing the stray dipolar field at certain locations. The SAF device may be associated with a relatively inhomogeneous stray dipolar magnetic field. For example, the SAF device may be associated with two geometrically separated anti-parallel magnetic moments that cause heterogeneity of the stray dipolar magnetic field. As a result, the SAF device may reduce an average magnitude of the stray dipolar magnetic field while also causing high local variations (e.g., local "maxima") of the stray dipolar magnetic field. The structure 200 of FIG. 2 may reduce an average magnitude of a stray dipolar magnetic field while also increasing homogeneity of the stray dipolar magnetic field. In a particular embodiment, the structure 200 of FIG. 2 is integrated within the reference layer 108 to "locally" compensate for a magnetic moment of the reference layer 108 and to reduce or cancel a dipolar coupling between the storage layer 104 and the reference layer 108.

Figure 3:
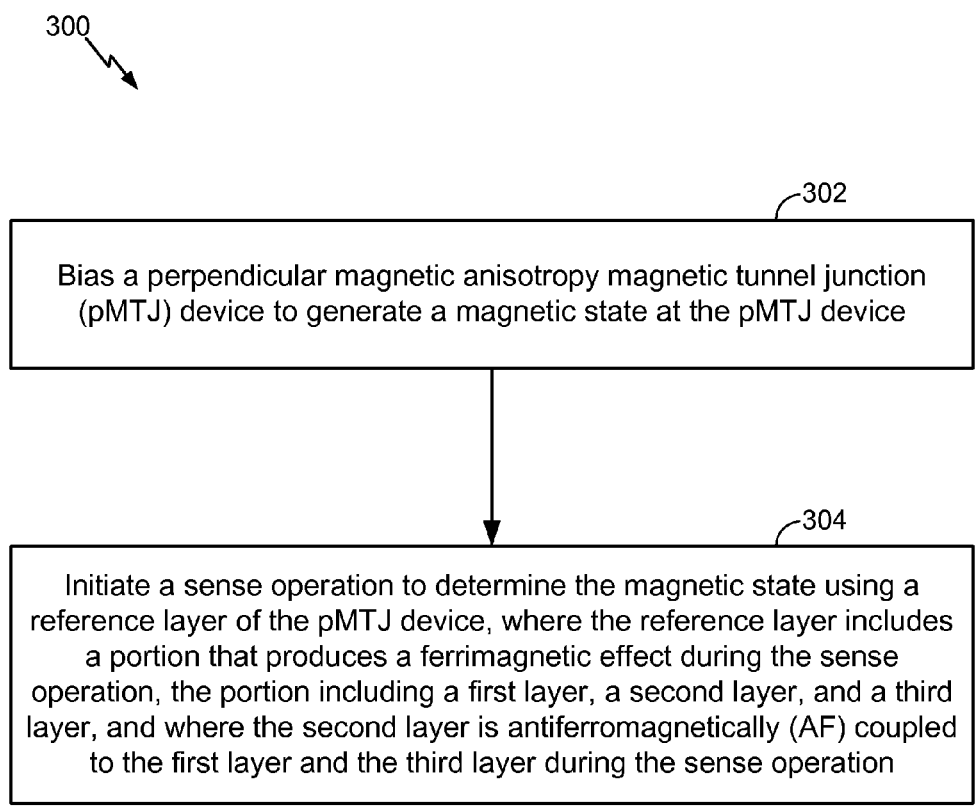
FIG. 3 is a flow chart of a particular illustrative embodiment of a method of operation of the pMTJ device of FIG. 1.

Referring to FIG. 3, a particular embodiment of a method is depicted and generally designated 300. The method 300 includes biasing a perpendicular magnetic anisotropy magnetic tunnel junction (pMTJ) device to generate a magnetic state at the pMTJ device, at 302. The pMTJ device may correspond to the pMTJ device 100, and the magnetic state may correspond to the magnetic state 114.

Biasing the pMTJ device may include applying a bias signal to an electrode of the pMTJ device to generate a switching current through the pMTJ device. For example, the pMTJ device 100 may be biased by applying a bias signal to the electrode 102 to generate a switching current through the pMTJ device 100. The pMTJ device 100 may be biased using control circuitry of a magnetoresistive random access memory (MRAM) device, as described further with reference to FIG. 4.

The method 300 further includes initiating a sense operation to determine the magnetic state using a reference layer of the pMTJ device, at 304. The reference layer includes a portion that produces a ferrimagnetic effect during the sense operation. The portion may correspond to the portion 112 and/or the structure 200. The portion includes a first layer, a second layer, and a third layer. The second layer antiferromagnetically (AF) couples the first layer and the third layer during the sense operation. The reference layer may correspond to the reference layer 108, and the portion may correspond to the portion 112 and/or the structure 200. The first layer may correspond to the layer 120 and/or the layer 204, the second layer may correspond to the layer 122 and/or the layer 206, and the third layer may correspond to the layer 124 and/or the layer 208, as illustrative examples.

In a particular embodiment, the pMTJ device 100 is sensed by applying a voltage difference across the pMTJ device 100, such as by applying a first (e.g., high) voltage to the electrode 102 while applying a second (e.g., low) voltage to the electrode 110 to generate a read current through the pMTJ device 100. The read current may be compared to a reference current to determine whether the pMTJ device 100 has a first resistance or a second resistance (e.g., to determine the orientation of the magnetic state 114).

In a particular embodiment, the magnetic state corresponds to either a parallel magnetic state or an anti-parallel magnetic state. To illustrate, the magnetic state 114 may have an orientation that is parallel relative to the magnetic state 116 or that is anti-parallel relative to the magnetic state 116. The magnetic state 114 may indicate one of a first logical bit value or a second logical bit value, such as a logical "0" bit value or a logical "1" bit value. The pMTJ device 100 may be sensed using a sense amplifier of an MRAM device, as described further with reference to FIG. 4.

The method 300 may enable data storage and retrieval using a reduced stray dipolar magnetic field associated with perpendicular magnetic anisotropy (PMA) of a pMTJ device. To illustrate, the portion 112 may produce a ferrimagnetic effect that cancels (or reduces) an average magnitude of a stray dipolar magnetic field generated by the reference layer 108 during operation of the pMTJ device 100. For example, the ferrimagnetic effect may reduce certain local "maxima" of the stray dipolar magnetic field, thus reducing the average magnitude of the stray dipolar magnetic field and increasing homogeneity of the stray dipolar magnetic field.

The method 300 may be implemented by an electronic device that includes a pMTJ device. The device may include a magnetoresistive random access memory (MRAM) device, such as an MRAM memory array. Alternatively or in addition, a pMTJ device may be integrated within another electronic device. For example, the electronic device may include a field-programmable gate array (FPGA) device, an application-specific integrated circuit (ASIC), a processing unit such as a central processing unit (CPU), a digital signal processor (DSP), a controller, another hardware device, a firmware device, another electronic device configured to store one or more bits of information, or a combination thereof. The device may correspond to an MRAM device that is configured to store data and/or instructions accessible by a processor, as described further with reference to FIG. 4.

Figure 4:
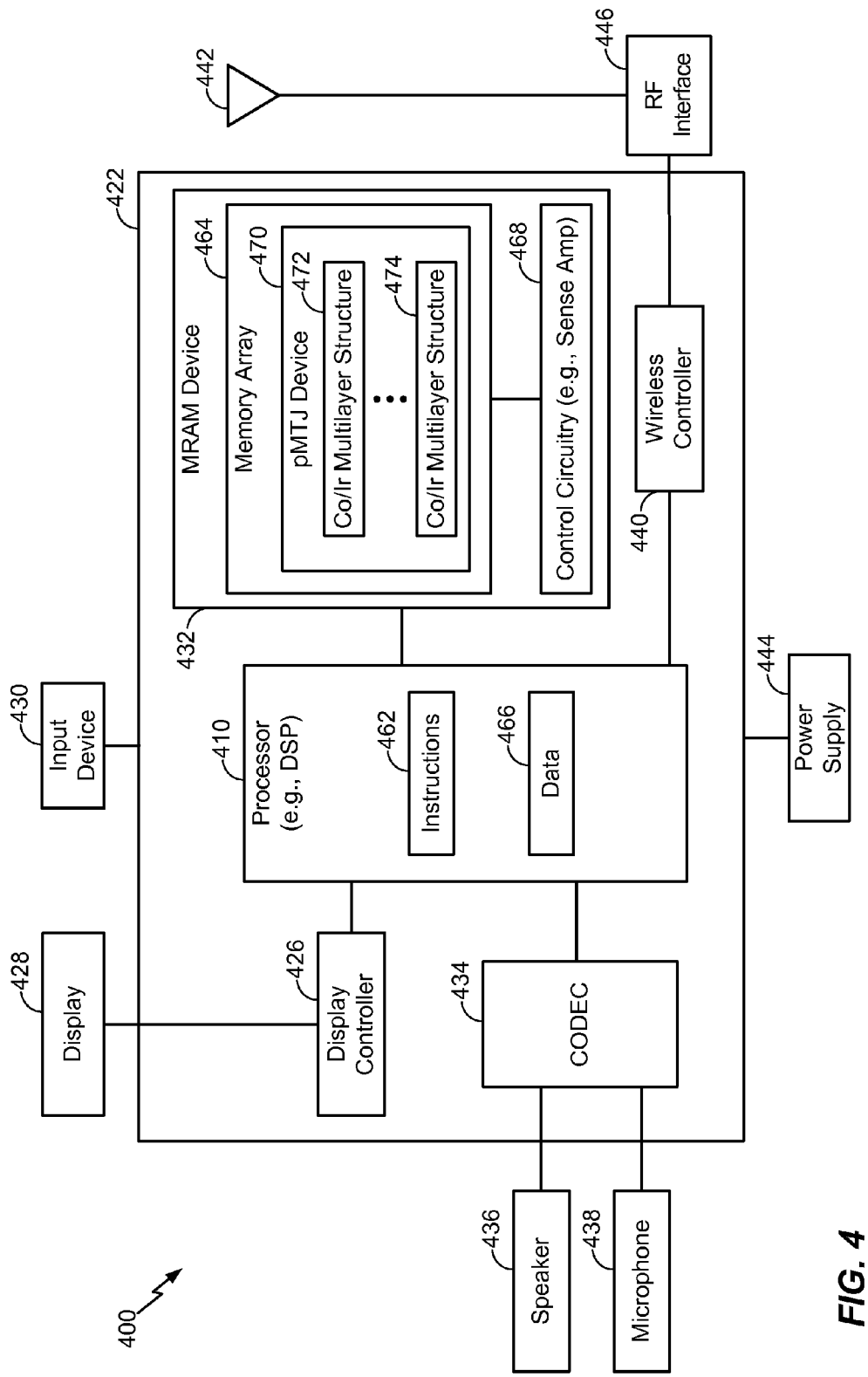
FIG. 4 is a block diagram of a device including a magnetoresistive random access memory (MRAM) device that includes the pMTJ device of FIG. 1.

Referring to FIG. 4, a block diagram of a particular illustrative embodiment of a device is depicted and generally designated 400. In a particular embodiment, the device 400 corresponds to a mobile device.

The device 400 includes a processor 410, such as a digital signal processor (DSP). The processor 410 may be coupled to a memory, such as to a magnetoresistive random access memory (MRAM) device 432. The MRAM device 432 may include a memory array 464, such as an array of perpendicular magnetic anisotropy magnetic tunnel junction (pMTJ) devices. The MRAM device 432 may further include control circuitry 468 configured to control the memory array 464 (e.g., a sense amplifier). In the example of FIG. 4, the memory array 464 includes a representative pMTJ device 470. The pMTJ device 470 may correspond to the pMTJ device 100 of FIG. 1.

The pMTJ device 470 may include one or more Co/Ir multilayer structures. For example, the pMTJ device 470 may include a Co/Ir multilayer structure 472 and a Co/Ir multilayer structure 474. One or both of the Co/Ir multilayer structures 472, 474 may correspond to the multilayer structure 222 of FIG. 2. The Co/Ir multilayer structures 472, 474 may be included in a reference layer of the pMTJ device 470, such as the reference layer 108 of FIG. 1. In an illustrative implementation, the reference layer includes a positive integer number of N Co/Ir multilayer structures, and N is selected based on a stray dipolar magnetic field associated with the pMTJ device 470. For example, N may be selected to offset an "expected" stray dipolar magnetic field that would occur during operation of the pMTJ device 470 if N=0. In an illustrative embodiment, N=5. It is noted that N may have another value, such as 1, 2, 4, 6, 10, etc.

The control circuitry 468 may be configured to write and to sense the magnetic state 114 of the pMTJ device 100. For example, a sense amplifier of the control circuitry 468 may "read" a data value stored at the pMTJ device 100 by generating a current through the pMTJ device 100 to determine if the pMTJ device 100 has a high resistance or a low resistance. In determining the resistance, the sense amplifier of the control circuitry 468 may compare a voltage due to the current through the pMTJ device 100 to a reference voltage. A high resistance value of the pMTJ device 100 may correspond to a first value (e.g., a logical "0" value), and a low resistance value of the pMTJ device 100 may correspond to a second value (e.g., a logical "1" value).

The processor 410 may read and write instructions 462 and/or data 466 at the MRAM device 432. For example, the processor 410 may cause the control circuitry 468 to store the instructions 462 and/or the data 466 to the memory array 464. As another example, the processor 410 may cause the control circuitry 468 to read the instructions 462 and/or the data 466 from the memory array 464. The magnetic state 114 may indicate a particular bit value of the instructions 462 or the data 466. In a particular embodiment, the control circuitry 468 is configured to perform the method 300 of FIG. 3.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434. FIG. 4 further indicates that a wireless controller 440 can be coupled to the processor 410. The wireless controller 440 may be further coupled to an antenna 442 via a radio frequency (RF) interface 446.

In a particular embodiment, the processor 410, the display controller 426, the MRAM device 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the antenna 442, the power supply 444, and the RF interface 446 are external to the system-on-chip device 422. However, each of the display 428, the input device 430, the speaker 436, the microphone 438, the antenna 442, the power supply 444, and the RF interface 446 can be coupled to a component of the system-on-chip device 422, such as to an interface or to a controller.

In conjunction with the described embodiments, an apparatus includes a perpendicular magnetic anisotropy magnetic tunnel junction (pMTJ) device (e.g., the pMTJ device 100). The apparatus includes means for generating (e.g., the storage layer 104) a configurable magnetic state (e.g., the magnetic state 114). The apparatus further includes means for generating (e.g., the reference layer 108) a reference magnetic state (e.g., the magnetic state 116). The means for generating the reference magnetic state includes means for producing a ferrimagnetic effect (e.g., the portion 112 and/or the structure 200). The means for producing the ferrimagnetic effect includes means for generating (e.g., the layer 120 and/or the layer 204) a first magnetic field, means for generating (e.g., the layer 124 and/or the layer 208) a second magnetic field, and means for antiferromagnetically (AF) coupling (e.g., the layer 122 and/or the layer 206) the means for generating the first magnetic field and the means for generating the second magnetic field.

In conjunction with the described embodiments, a computer-readable medium (e.g., the MRAM device 432) stores instructions (e.g., the instructions 462) that are executable by a processor (e.g., the processor 410). The computer-readable medium includes a perpendicular magnetic anisotropy magnetic tunnel junction (pMTJ) device (e.g., the pMTJ device 100). The pMTJ device includes a storage layer (e.g., the storage layer 104) and a reference layer (e.g., the reference layer 108). The reference layer includes a portion (e.g., the portion 112 and/or the structure 200) configured to produce a ferrimagnetic effect. The portion includes a first layer, a second layer, and a third layer. The second layer is configured to antiferromagnetically (AF) couple the first layer and the third layer during operation of the pMTJ device. The first layer may correspond to the layer 120 and/or the layer 204, the second layer may correspond to the layer 122 and/or the layer 206, and the third layer may correspond to the layer 124 and/or the layer 208, as illustrative examples. In an illustrative embodiment, the pMTJ device stores a particular bit value of the instructions.

Figure 5:
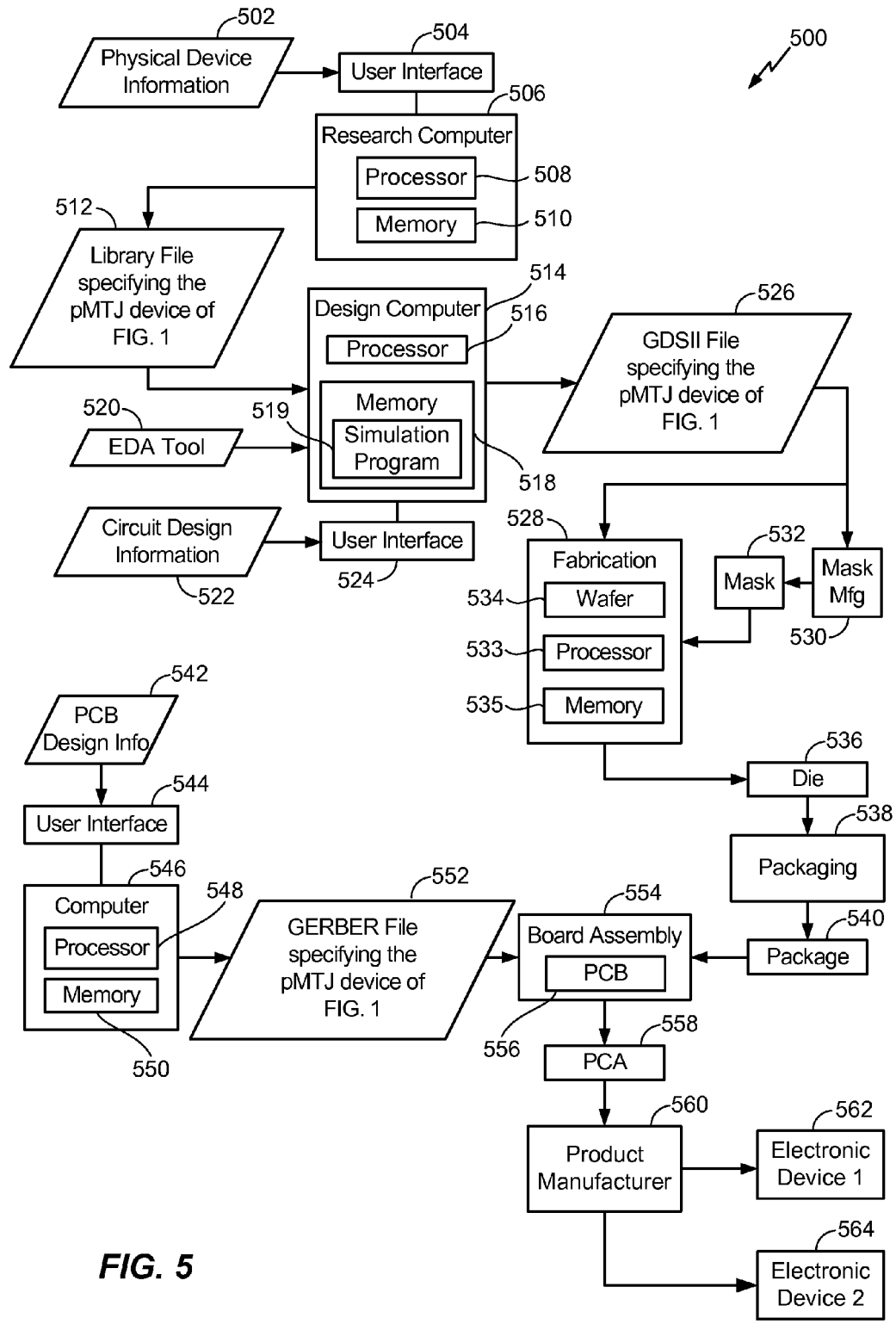
FIG. 5 is a data flow diagram of a particular illustrative embodiment of a manufacturing process to manufacture electronic devices that include the pMTJ device of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into semiconductor chips. The chips are then employed in devices described above (e.g., within the device 400). FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the pMTJ device 100, the structure 200, the system-on-chip device 422, or a combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may specify a library of semiconductor devices including the pMTJ device 100, the structure 200, the system-on-chip device 422, or a combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the pMTJ device 100, the structure 200, the system-on-chip device 422, or a combination thereof, of the library file 512. For example, a user of the design computer 514 may enter circuit design information 522 via a user interface 524 coupled to the design computer 514. The circuit design information 522 may include design information representing at least one physical property of a semiconductor device, such as the pMTJ device 100, the structure 200, the system-on-chip device 422, or a combination thereof. To illustrate, the circuit design information 522 may identify particular circuits and relationships to other elements in a circuit design, positioning information, feature size information, interconnection information, or other information representing a physical property of a semiconductor device.

In a particular embodiment, the design computer 514 executes a simulation program 519 to determine (or to enable a user to determine) one or more properties of the portion 112 and/or the structure 200 based on the circuit design information 522. To illustrate, the circuit design information 522 may indicate circuit parameters associated with the pMTJ device 100, such as dimensions, materials, and magnetization characteristics (e.g., coercivity) of any of the electrodes 102, 110, the storage layer 104, the barrier layer 106, and/or the reference layer 108. As a particular illustrative example, the circuit design information 522 may indicate that the storage layer 104 is to be fabricated with a thickness of approximately 9 angstrom (Å) and a width of approximately 40 nanometers (nm). The design computer 514 may execute the simulation program 519 to calculate an expected stray dipolar magnetic field associated with operation of the pMTJ device 100 based on the circuit design information 522 (e.g., based on coercivity and/or one or more other characteristics of one or more materials of the pMTJ device 100). Based on the expected stray dipolar magnetic field, the design computer 514 may determine one or more of the thicknesses 214, 216, 218, 220.

As an illustrative example, the design computer 514 may execute the simulation program 519 to select a thickness of a layer, such as the thickness 218 of the layer 206, that induces a threshold amount of antiferromagnetic (AF) coupling between neighboring cobalt layers (e.g., the layers 204, 208) based on device characteristics specified by the circuit design information 522. For example, the design computer 514 execute the simulation program 519 to adjust the thickness 218 of the layer 206 between 5 angstrom (Å) (which may correspond to a high AF coupling of the layers 204, 208) and 8 Å (which may correspond to a low or zero AF coupling of the layers 204, 208) based on device characteristics specified by the circuit design information 522.

Alternatively or in addition to adjusting AF coupling, the design computer 514 may execute the simulation program 519 to select a thickness of a layer, such as the thicknesses 216, 220 of the layers 204, 208, to "tune" a perpendicular magnetic anisotropy (PMA) of the pMTJ device 100. In this example, the thicknesses 216, 220 may be selected to achieve a threshold amount of PMA based on device characteristics (e.g., magnitude of switching current of the pMTJ device 100) that are specified by the circuit design information 522. The threshold amount of AF coupling and/or the threshold amount of PMA may be selected to enable both high PMA and low net magnetization of the reference layer 108, thus reducing a stray dipolar magnetic field (e.g., by producing a ferrimagnetic effect having a magnitude that is substantially equal and substantially opposite to a magnitude of the stray dipolar magnetic field).

Alternatively or in addition, the circuit design information 522 may indicate a "target" magnitude (or "tolerance" range) of the stray dipolar magnetic field during operation of the pMTJ device 100. The design computer 514 may execute the simulation program 519 and may select a cobalt layer thickness (e.g., the thicknesses 216, 220) that causes a particular AF coupling between the layers 204, 208 that reduces a local magnetic moment of the reference layer 108. Reducing the local magnetic moment of the reference layer 108 may cancel or reduce the stray dipolar magnetic field to within the tolerance range.

As a particular illustrative example, the circuit design information 522 may specify that the tolerance range corresponds to an absolute value of an average magnitude of the stray dipolar magnetic field of less than 100 oersted (Oe) and that a "default" cobalt layer thickness (e.g., the thickness 216 and/or the thickness 220) may be approximately 8 angstrom (Å). In this illustrative example, the design computer 514 may execute the simulation program 519 using the circuit design information 522 to determine that an expected average magnitude of the stray dipolar magnetic field is approximately 109 Oe. The design computer 514 may execute the simulation program 519 to adjust the cobalt layer thickness (e.g., the thickness 216 and/or the thickness 220) from approximately 8 Å to approximately 10 Å to adjust the expected average magnitude of the stray dipolar magnetic field of approximately −66 Oe. In this example, the design computer 514 executes the simulation program 519 to reduce the absolute value of the average magnitude of the stray dipolar magnetic field to be less than 100 Oe. It should be appreciated that the foregoing example is provided for illustrative purposes and that design parameters will depend on the particular application.

As another illustrative example, the design computer 514 may execute the simulation program 519 to select a positive integer number N of structures corresponding to the multi-layer structure 222 to "stack" within the reference layer 108. In a particular illustrative embodiment, N=1 corresponds to a configuration that includes a "minimum" number of multilayer structures that reduce or cancel the stray dipolar magnetic field, and N>2 corresponds to a configuration that reduces the stray dipolar magnetic field while also increasing device stability (e.g., by reducing device susceptibility to temperature and/or process variations) and increasing device PMA to within a threshold range specified by the circuit design information 522.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the pMTJ device 100, the structure 200, the system-on-chip device 422, or a combination thereof, in addition to other circuits or information. To illustrate, the data file may include information corresponding to a system-on-chip (SOC) that includes the pMTJ device 100, the structure 200, one or more components of the system-on-chip device 422, or a combination thereof, and that also includes additional electronic circuits and components within the SOC.

The GDSII file 526 may be received at a fabrication process 528 to manufacture the pMTJ device 100, the structure 200, the system-on-chip device 422, or a combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit having the pMTJ device 100, the structure 200, the system-on-chip device 422, or a combination thereof.

To further illustrate, a processor 533 and a memory 535 may initiate and/or control the fabrication process 528. The memory 535 may include executable instructions such as computer-readable instructions or processor-readable instructions. The executable instructions may include one or more instructions that are executable by a processor, such as the processor 533.

The fabrication process 528 may be implemented by a fabrication system that is fully automated or partially automated. For example, the fabrication process 528 may be automated according to a schedule. The fabrication system may include fabrication equipment (e.g., processing tools) to perform one or more operations to form a device, such as an MRAM device. For example, the fabrication equipment may be configured to deposit one or more materials, epitaxially grow one or more materials, conformally deposit one or more materials, apply a hardmask, apply an etching mask, perform etching, perform planarization, form an MTJ stack, and/or perform a wafer cleaning process, etc.

The fabrication system (e.g., an automated system that performs the fabrication process 528) may have a distributed architecture (e.g., a hierarchy). For example, the fabrication system may include one or more processors, such as the processor 533, one or more memories, such as the memory 535, and/or one or more controllers that are distributed according to the distributed architecture. The distributed architecture may include a high-level processor that controls or initiates operations of one or more low-level systems. For example, a high-level processor may include one or more processors, such as the processor 533, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 533.

Alternatively, the processor 533 may be a part of a high-level system, subsystem, or component of the fabrication system. In another embodiment, the processor 533 initiates or controls distributed processing operations associated with multiple levels and components of a fabrication system.

Thus, the processor 533 may include processor-executable instructions that, when executed by the processor 533, cause the processor 533 to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The executable instructions included in the memory 535 may enable the processor 533 to initiate or control formation of a device or structure described herein. For example, the executable instructions may enable the processor 533 to initiate or control formation of the pMTJ device 100, the structure 200, the system-on-chip device 422, or a combination thereof. The die 536 may include the pMTJ device 100, the structure 200, the system-on-chip device 422, or a combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board. The packaged semiconductor device may correspond to the package 540, and the package 540 may include the pMTJ device 100, the structure 200, the system-on-chip device 422, or a combination thereof.

The computer 546 may be configured to transform the PCB design information 542 to generate a data file, such as a GERBER file 552, with data that includes physical positioning information of a packaged semiconductor device on a circuit board, as well as layout of electrical connections such as traces and vias. The packaged semiconductor device may correspond to the package 540 and may include the pMTJ device 100, the structure 200, the system-on-chip device 422, or a combination thereof. In other embodiments, the data file generated by the transformed PCB design information may have a format other than a GERBER format.

The GERBER file 552 may be received at a board assembly process 554 and may be used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a mobile device, a computer, a set top box, a music player, a video player, an entertainment unit, a navigation device, a communications device, a personal digital assistant (PDA), or a fixed location data unit, into which the pMTJ device 100, the structure 200, the system-on-chip device 422, or a combination thereof, is integrated. As another illustrative, non-limiting example, one or more of the electronic devices 562 and 564 may include mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. It should be appreciated that the disclosure is not limited to these illustrated devices.

A device that includes the pMTJ device 100, the structure 200, the system-on-chip device 422, or a combination thereof, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. As a particular example, operations corresponding to the method 300 of FIG. 3 may be implemented at hardware (e.g., a sense amplifier) of the control circuitry 468 of FIG. 4. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a perpendicular magnetic anisotropy magnetic tunnel junction (pMTJ) device including:
        a storage layer contacting a tunneling layer; and
        a reference layer including an equal number of magnetic layers and coupling layers, wherein a first coupling layer of the coupling layers is in contact with the tunneling layer, and wherein the magnetic layers and the coupling layers form a cobalt/iridium (Co/Ir) multilayer structure.

2. The apparatus of claim 1, wherein the tunneling layer is configured to enable a tunnel magnetoresistance (TMR) effect at the pMTJ device during operation of the pMTJ device, and wherein the magnetic layers and the coupling layers comprise a first magnetic layer, a second coupling layer, a second magnetic layer, and a third coupling layer.

3. The apparatus of claim 2, wherein the second coupling layer is configured to antiferromagnetically (AF) couple the first magnetic layer and the second magnetic layer during operation of the pMTJ device.

4. The apparatus of claim 1, wherein a portion of the reference layer is configured to produce a ferrimagnetic effect, wherein the reference layer is associated with a stray dipolar magnetic field during operation of the pMTJ device, and wherein the reference layer is configured to locally reduce the stray dipolar magnetic field via the ferrimagnetic effect during operation of the pMTJ device.

5. The apparatus of claim 1, wherein the magnetic layers comprise a first cobalt (Co) containing magnetic layer and a second Co containing magnetic layer, wherein the coupling layers comprise a first iridium (Ir) containing coupling layer and a second Ir containing coupling layer, wherein the first Ir containing coupling layer is between the first Co containing magnetic layer and the second Co containing magnetic layer, and wherein and the second Co containing magnetic layer is between the first Ir containing coupling layer and the second Ir containing coupling layer.

6. The apparatus of claim 1, wherein the reference layer further includes a second Co/Ir multilayer structure.

7. The apparatus of claim 1, wherein a junction between one of the magnetic layers and one of the coupling layers is configured to enable a perpendicular magnetic anisotropy (PMA) of the pMTJ device.

8. The apparatus of claim 1, wherein the magnetic layers and the coupling layers are included in a portion of the reference layer, and wherein the portion includes a multilayer synthetic ferrimagnet (SFi).

9. The apparatus of claim 1, further comprising a magnetoresistive random access memory (MRAM) device that comprises the pMTJ device.

10. The apparatus of claim 9, further comprising an electronic device selected from a mobile device, a computer, a set top box, a music player, a video player, an entertainment unit, a navigation device, a communications device, a personal digital assistant (PDA), or a fixed location data unit, wherein the MRAM device is integrated within the electronic device.

11. A method comprising:
    biasing a perpendicular magnetic anisotropy magnetic tunnel junction (pMTJ) device to generate a magnetic state at the pMTJ device; and
    initiating a sense operation to determine the magnetic state using a reference layer of the pMTJ device, the reference layer comprising a portion that produces a ferrimagnetic effect and that includes a coupling layer adjacent to a tunneling layer in contact with a storage layer, the portion comprising magnetic layers and coupling layers, the magnetic layers comprising cobalt (Co) and the coupling layers comprising iridium (Ir).

12. The method of claim 11, wherein the tunneling layer enables a tunnel magnetoresistance (TMR) effect at the pMTJ device during operation of the pMTJ device, and wherein the magnetic state corresponds to either a parallel magnetic state of the storage layer relative to the reference layer or to an anti-parallel magnetic state of the storage layer relative to the reference layer.

13. The method of claim 11, wherein a junction between one of the magnetic layers and one of the coupling layers generates a perpendicular magnetic anisotropy (PMA) of the pMTJ device, and wherein the magnetic state indicates one of a first logical bit value or a second logical bit value.

14. The method of claim 11, wherein one of the coupling layers antiferromagnetically (AF) couples two of the magnetic layers, and wherein biasing the pMTJ device comprises applying a bias signal to an electrode of the pMTJ device to generate a switching current through the pMTJ device.

15. The method of claim 11, wherein the pMTJ device is integrated within a magnetoresistive random access memory (MRAM) device, and wherein the pMTJ is sensed using a sense amplifier of the MRAM device.

16. The method of claim 11, wherein the reference layer is associated with a stray dipolar magnetic field during operation of the pMTJ device, and wherein the portion is further configured to locally reduce the stray dipolar magnetic field via the ferrimagnetic effect during operation of the pMTJ device.

17. An apparatus comprising:
means for enabling a tunnel magnetoresistance (TMR) effect at a perpendicular magnetic anisotropy magnetic tunnel junction (pMTJ) device;
means for generating a configurable magnetic state of the pMTJ device, the means for generating the configurable magnetic state in contact with the means for enabling; and
means for generating a reference magnetic state of the pMTJ device, the means for generating the reference magnetic state comprising:
means for antiferromagnetically (AF) coupling magnetic layers of the pMTJ device, the means for AF coupling contacting the means for enabling, and
means for generating a magnetic field at the pMTJ device, the means for generating the magnetic field including magnetic layers, and the means for AF coupling including coupling layers, the magnetic layers comprising cobalt (Co) and the coupling layers comprise iridium (Ir).

18. The apparatus of claim 17, wherein the means for generating the configurable magnetic state comprises a storage layer of the pMTJ device.

19. The apparatus of claim 17, wherein the means for generating the reference magnetic state corresponds to a reference layer of the pMTJ device.

20. The apparatus of claim 17, wherein the means for generating the magnetic field and the means for AF coupling the magnetic layers form a multilayer synthetic ferrimagnet (SFi).

21. The apparatus of claim 17, wherein a junction between one of the magnetic layers and one of the coupling layers is configured to generate a perpendicular magnetic anisotropy (PMA) of the pMTJ device.

22. The apparatus of claim 17, wherein the means for generating the reference magnetic state comprises means for producing a ferrimagnetic effect, and wherein the means for producing the ferrimagnetic effect comprises a Co/Ir multilayer structure.

23. The apparatus of claim 17, further comprising a magnetoresistive random access memory (MRAM) device that comprises the pMTJ device.

24. The apparatus of claim 23, further comprising an electronic device selected from a mobile device, a computer, a set top box, a music player, a video player, an entertainment unit, a navigation device, a communications device, a personal digital assistant (PDA), or a fixed location data unit, wherein the MRAM device is integrated within the electronic device.

25. A computer-readable medium storing instructions that are executable by a processor, the computer-readable medium comprising a perpendicular magnetic anisotropy magnetic tunnel junction (pMTJ) device comprising:
a storage layer contacting a tunneling layer; and
a reference layer including an equal number of magnetic layers and coupling layers, wherein a first coupling layer of the coupling layers is in contact with the tunneling layer, and wherein the magnetic layers and the coupling layers form a first cobalt/iridium (Co/Ir) multilayer structure.

26. The computer-readable medium of claim 25, wherein the tunneling layer is configured to enable a tunnel magnetoresistance (TMR) effect at the pMTJ device during operation of the pMTJ device, wherein a portion of the reference layer includes one of the coupling layers antiferromagnetically (AF) coupled with two of the magnetic layers, wherein the portion is configured to produce a ferrimagnetic effect, and wherein the pMTJ device stores a particular bit value of the instructions.

27. The computer-readable medium of claim 25, integrated within a magnetoresistive random access memory (MRAM) device.

28. The computer-readable medium of claim 25, integrated within a mobile device.

* * * * *